US006336818B1

United States Patent
Bayer

(10) Patent No.: US 6,336,818 B1
(45) Date of Patent: Jan. 8, 2002

(54) ELECTRICAL CONNECTOR FOR CONNECTION BETWEEN COIL AND PRINTED CIRCUIT BOARD IN AUTOMOTIVE ANTI-LOCK BRAKING SYSTEM

(75) Inventor: Michael Bayer, White Lake, MI (US)

(73) Assignee: Continental Teves, Inc., Auburn Hills, MI (US)

( * ) Notice: Subject to any disclaimer, the term of this patent is extended or adjusted under 35 U.S.C. 154(b) by 0 days.

(21) Appl. No.: 09/482,286

(22) Filed: Jan. 13, 2000

Related U.S. Application Data

(63) Continuation-in-part of application No. 09/210,638, filed on Dec. 11, 1998, now abandoned.

(51) Int. Cl.$^7$ .......................... H01R 12/00; H05K 1/00; H01F 27/29
(52) U.S. Cl. .......................................... 439/78; 336/192
(58) Field of Search .......................... 439/78, 62, 555, 439/567; 336/192, 198

(56) References Cited

U.S. PATENT DOCUMENTS

| | | | | |
|---|---|---|---|---|
| 3,043,994 A | * | 7/1962 | Anderson et al. ........... 317/158 |
| 3,451,021 A | * | 6/1969 | Atherton ..................... 335/260 |
| 4,661,792 A | * | 4/1987 | Watkins ....................... 336/65 |
| 4,904,974 A | * | 2/1990 | Tsuji .......................... 336/192 |
| 5,108,308 A | * | 4/1992 | Northcraft et al. .......... 439/555 |
| 5,137,454 A | * | 8/1992 | Baechtle ...................... 439/62 |
| 5,334,048 A | * | 8/1994 | Bowers et al. .............. 439/567 |
| 5,659,277 A | * | 8/1997 | Joshi et al. ................. 335/216 |
| 5,673,013 A | * | 9/1997 | Moody et al. .............. 336/192 |
| 6,060,975 A | * | 5/2000 | Rowe ......................... 336/198 |

* cited by examiner

Primary Examiner—Khiem Nguyen
Assistant Examiner—Chandrika Prasad
(74) Attorney, Agent, or Firm—Rader, Fishman & Grauer PLLC

(57) ABSTRACT

An electrical connector for connecting a solenoid wire coil to a printed circuit board in an automotive anti-lock braking system has a coil bobbin, around which the wire coil is wound. The wire coil has pre-tinned sections that are wrapped over stems protruding from the coil bobbin. When the stems are inserted in through-holes of the printed circuit board, the pre-tinned sections contact the through-holes, establishing a connection between the solenoid coil wire and the printed circuit board without soldering. In a preferred embodiment, the connector includes a bobbin outer mold and a stem outer mold covering the bobbin and stems, respectively, for protection against environmental conditions. A seal at the juncture between the stem and bobbin outermolds provides further protection of the coil.

7 Claims, 3 Drawing Sheets

ELECTRICAL CONNECTOR FOR CONNECTION BETWEEN COIL AND PRINTED CIRCUIT BOARD IN AUTOMOTIVE ANTI-LOCK BRAKING SYSTEM This application is a continuation-in-part of copending application Ser. No. 09/210,638 filed on Dec. 11, 1998, now abandoned.

FIELD OF THE INVENTION

The present invention relates to electrical connectors for use in such automotive anti-lock braking systems, and more particularly to an electrical connector for mounting a coil onto a printed circuit board.

BACKGROUND

In an automotive anti-lock braking system (ABS), wheel-speed sensors monitor the motion of the wheels. If one of the wheels begins to lock, the peripheral wheel deceleration and wheel slip increase sharply. When these quantities exceed certain thresholds, a controller circuit, typically mounted on a printed circuit board (PCB), commands a solenoid-valve unit to stop or reduce the buildup of wheel-brake pressure until a lock up condition is no longer imminent. To alleviate pressure buildup, the solenoid rapidly actuates the brakes in a "pumping" action that causes the wheel-brake pressure to undergo a succession of buildup, reduction, and holding phases.

Inductive coils in the solenoid-valve unit are typically connected to the PCB by solder joints. The coils are connected to the valve block that houses the solenoid-valve unit through a mechanical interface. Various tolerances must be accommodated in conventional mechanical interfaces, increasing their design complexity and manufacturing cost.

There is a need for a simple inductive coil structure that can be connected securely to a PCB without the need for a soldered connection while keeping the coil structure simple.

SUMMARY OF THE INVENTION

A connector according to the present invention has a coil bobbin with one or more protruding stems wrapped with a pre-tinned portion of a coil wire, such that the pre-tinned portion contacts through-holes of a printed circuit board (PCB) when the stems are inserted into the through-holes. An interference fit between the through-holes and the connector creates a tin-tin type connection system between the connector and the PCB. As a result, the design complexity of the connector is reduced, and the need to solder the connector to the PCB is eliminated.

In one embodiment, an electrical connector for establishing a solderless connection between a solenoid wire coil and a printed circuit board for use in an automotive anti-lock braking system includes a coil bobbin having at least one stem extending from a first surface thereof. A wire is wound in a coil arrangement around the coil bobbin and has a pre-tinned portion disposed over an end portion of the step for insertion into the through-hole of the PCB. A bobbin overmold covers the coil bobbin to protect the wire from harsh environmental conditions. A stem overmold can be formed over a portion of the stem, leaving the end portion of the stem exposed for connection to the PCB. A seal is optionally provided on the stem overmold at the juncture between the stem overmold and the bobbin overmold to prevent water from entering the coil area

BRIEF DESCRIPTION OF THE DRAWINGS

These and other aspects and advantages of the present invention will become apparent upon reading the following detailed description and upon reference to the drawings, in which.

DETAILED DESCRIPTION

The present invention is applicable to a variety of automotive anti-lock braking (ABS) systems. The invention has been found to be particularly advantageous in environments in which a simple interface between a solenoid coil and control circuitry disposed on a printed circuit board (PCB) is desirable. An appreciation of various aspects of the invention can be gained through a discussion of various application examples operating in such environments.

According to one embodiment of the present invention, a coil bobbin has one or more protruding stems wrapped with a pre-tinned coil wire. The stems are designed to fit into the through-hole of the PCB. Sufficient interference between the through-hole and the stems of the connector creates a tin-tin type electrically conductive connection system. As a result, the design complexity of the connector is reduced, and the need to solder the connector to the PCB is eliminated.

Figure 1:
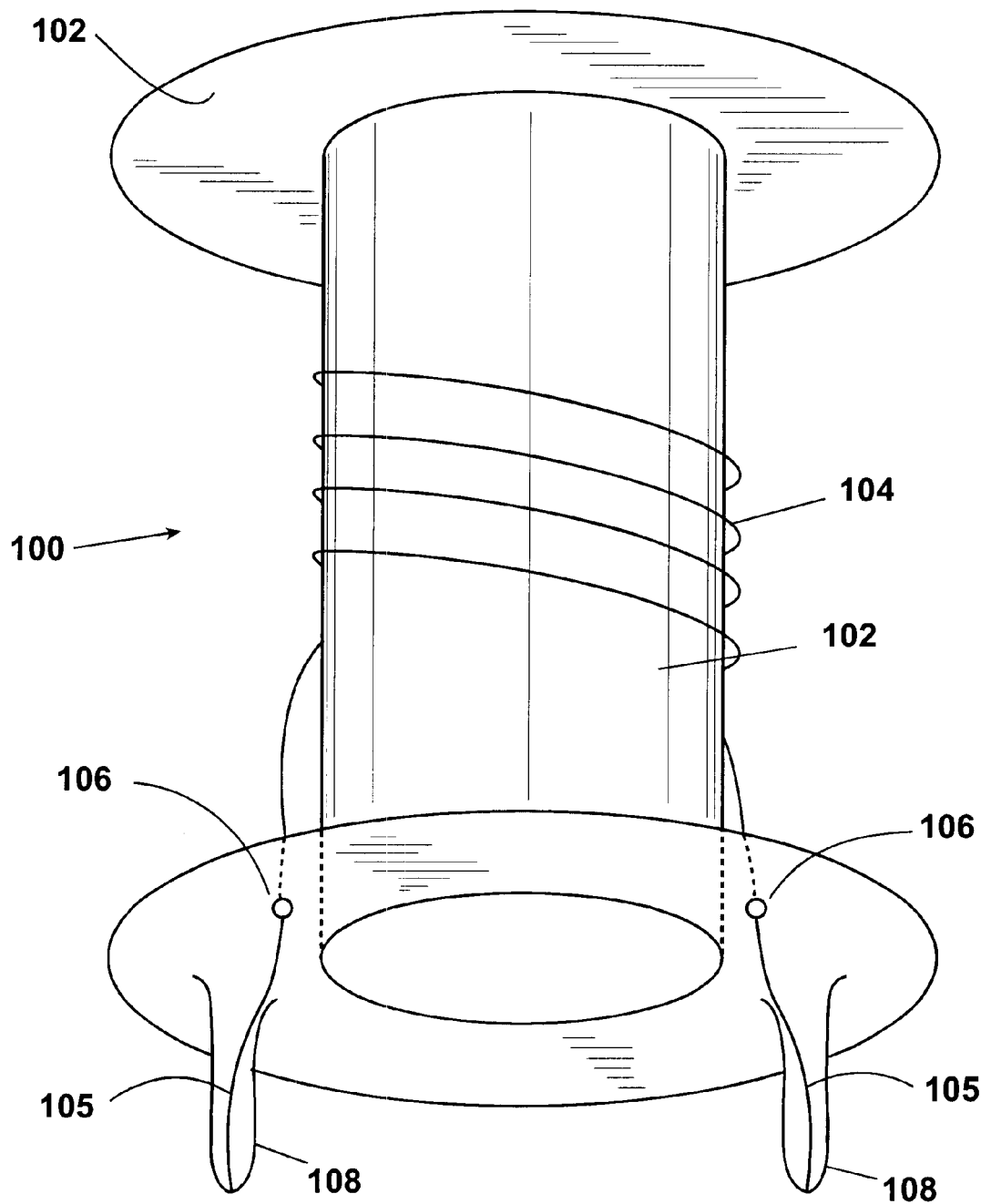
FIG 1. illustrates an inner portion of the electrical connector according to the present invention.

FIG. 1 depicts an example of an electrical connector 100 for connecting a solenoid coil to a PCB according to a particular embodiment of the present invention. A coil bobbin 102 provides the main structure for the connector 100. A coil wire 104 is wrapped around the coil bobbin 102. A portion 105 of the coil wire 104 is pretinned and passes through holes 106 in the bottom surface of the coil bobbin 102. The pre-tinned portion 105 of the coil wire 104 is then wrapped over or around stems 108 that protrude from the bottom surface of the coil bobbin 102. Wrapping the coil wire 104 over the stems 108 provides electrically conductive points where the connector 100 can connect with the PCB.

Figure 2:
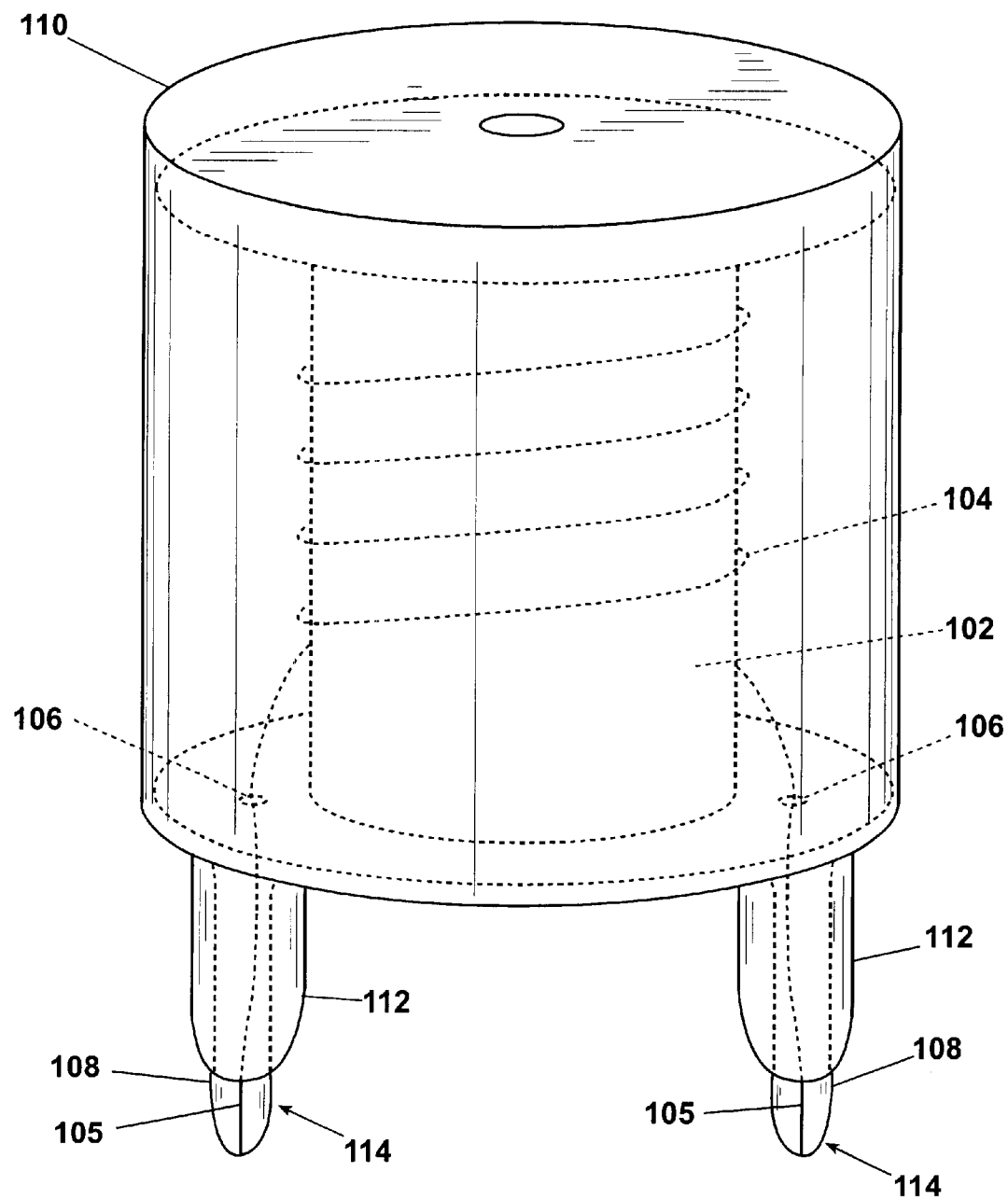
FIG. 2 illustrates an outer portion of the inventive electrical connector.

FIG. 2 illustrates the connector 100 of FIG. 1 after it has been covered by a bobbin outermold 110 and stem outermolds 112. The outermolds 110, 112 protect the coil wire 104 from being damaged from environmental conditions. As shown in the figure, end portions 114 of the stems 108 protrude from the stem outermolds 112 to allow electrical contact between the pre-tinned wire portions 105 and the PCB. The outermolds 110, 112 can be made of any material that can protect the coil wire 104 from environmental conditions. Preferably, the outermolds 110, 112 are made of plastic.

Figure 3:
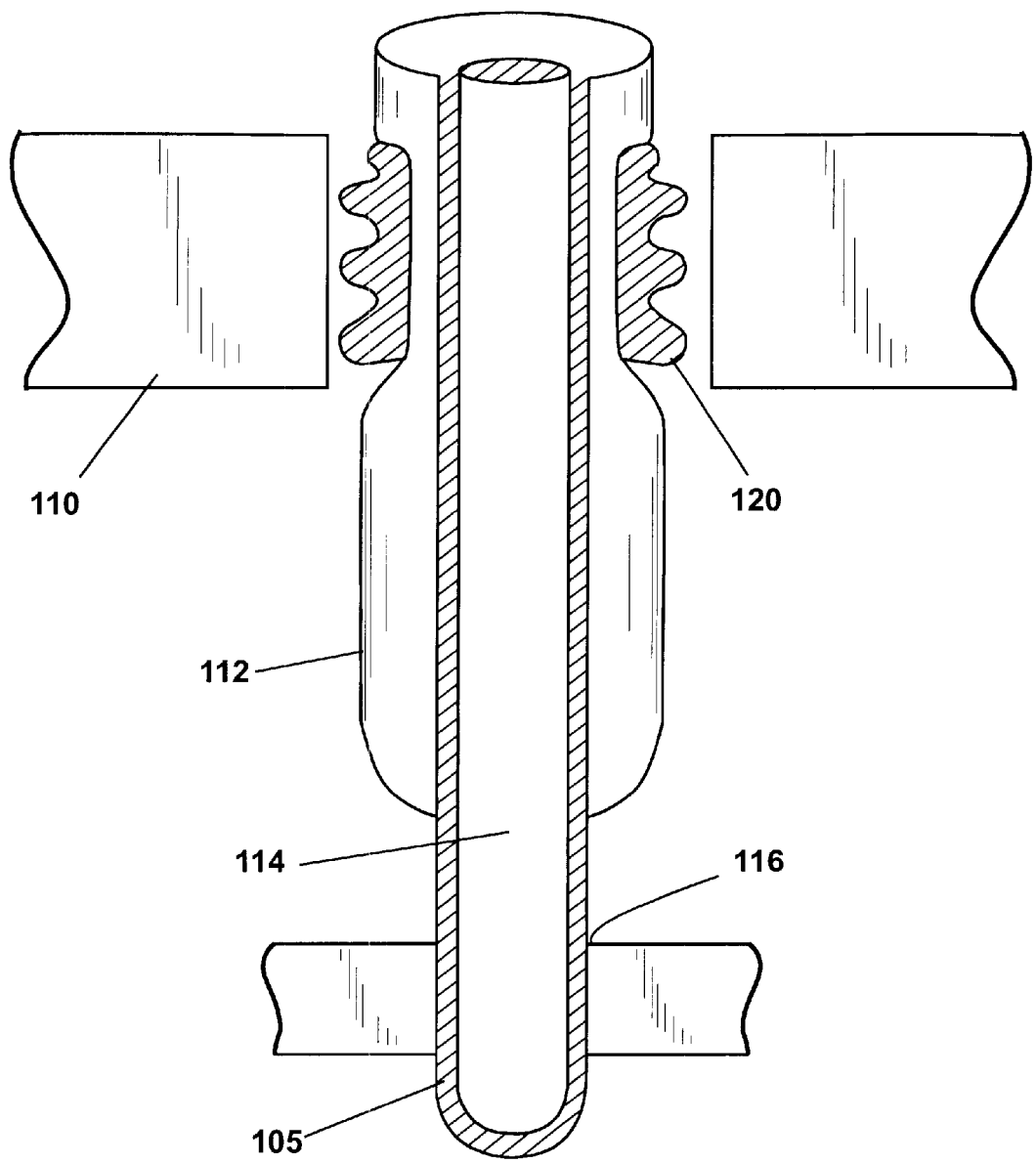
FIG. 3 is a magnified cross-sectional view of a stem portion of the electrical connector shown in FIG. 2.

FIG. 3 is an enlarged view of the stem 108 area after it has been connected to a PCB through-hole 116. As explained above, the plastic stem 108 has an end portion 114 with the pre-tinned portion 105. FIG. 3 shows this end portion 114 inserted through a plated through-hole of a PCB 116. As noted above, wrapping the pre-tinned portion 105 of the coil wire 104 over the end portion 108 provides a structure for establishing a connection between the coil wire 104 and the PCB when the end portion 114 of the stem 108 is inserted through the through-hole 116. A seal 120 may be formed on a portion of the stem outermold 112 where the stem 108 protrudes from the bobbin outermold 110. The seal 120 helps prevent water or other contaminants from entering the bobbin outermold 110. FIG. 3 shows the seal 120 as a multi-lip seal, but any known sealing structure, such as silica gel or an O-ring, could also be used to form the seal 120.

By wrapping the pre-tinned portion 105 of the wire over the stem 108 as described above, a connection can be established between the coil wire 104 and the PCB through-hole 116 without soldering. As a result, the interface between the coil and the solenoid valve block is simplified, reducing manufacturing costs.

The various embodiments described above are provided by way of illustration only and should not be construed to limit the invention. Those skilled in the art will readily recognize various modifications and changes that can be made to these embodiments without strictly following the example embodiments and applications illustrated and described herein, and without departing from the true spirit and scope of the present invention, which is set forth in the following claims.

What is claimed is:

1. A solderless connector for connecting a solenoid wire coil to a printed circuit board in an automotive anti-lock braking system, comprising:
    a coil bobbin having an end surface, said end surface having at least one hole disposed therethrough;
    at least one stem extending from said end surface, said stem having an end portion adapted to fit into a through-hole of the printed circuit board; and
    a wire wound around the coil bobbin to form the solenoid wire coil, said wire having a pre-tinned portion that is inserted through said hole and disposed over the end portion of said at least one stem.

2. The solderless connector according to claim 1, further comprising a bobbin outermold covering said coil bobbin.

3. The solderless connector according to claim 1, further comprising at least one stem outermold covering said at least one stem, said stem overmold having an opening through which the end portion of said stem extends.

4. The solderless connector according to claim 1, further comprising:
    a bobbin outermold covering said coil bobbin; and
    at least one stem outermold covering said at least one stem, said stem overmold having an opening through which the end portion of said stem extends.

5. The solderless connector according to claim 4, further comprising a seal disposed on said at least one stem outermold at a juncture between said stem outermold and said bobbin outermold.

6. The solderless connector according to claim 5, wherein said seal is selected from the group consisting of a multi-lip seal, an O-ring, and silica gel.

7. A solderless connector for connecting a solenoid wire coil to a printed circuit board in an automotive anti-lock braking system, comprising:
    a coil bobbin having an end surface, said end surface having at least one hole disposed therethrough;
    two stems extending from said end surface, each stem having an end portion adapted to fit into a through-hole of the printed circuit board;
    a wire wound around the coil bobbin to form the solenoid wire coil, said wire having a pre-tinned portion that is inserted through said hole and is disposed over the end portion of said at least one stem;
    a bobbin outermold covering said coil bobbin;
    a stem outermold covering each stem, said stem overmold having an opening through which the end portion of said stem extends; and
    a seal disposed on each stem outermold at a juncture between said stem outermold and said bobbin outermold.

\* \* \* \* \*